(12) United States Patent
Tuominen et al.

(10) Patent No.: US 11,445,601 B2
(45) Date of Patent: Sep. 13, 2022

(54) COMPONENT CARRIER AND METHOD OF MANUFACTURING A COMPONENT CARRIER

(71) Applicant: AT&S Austria Technologie & Systemtechnik Aktiengesellschaft, Leoben (AT)

(72) Inventors: Mikael Tuominen, Pernio (FI); Seok Kim Tay, Singapore (SG)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 17/247,832

(22) Filed: Dec. 24, 2020

(65) Prior Publication Data
US 2021/0204399 A1  Jul. 1, 2021

(30) Foreign Application Priority Data
Dec. 31, 2019  (CN) .......................... 201911412393.6

(51) Int. Cl.
*H05K 1/02* (2006.01)
*H05K 1/18* (2006.01)
(Continued)

(52) U.S. Cl.
CPC .......... *H05K 1/0271* (2013.01); *H01L 21/481* (2013.01); *H01L 21/4857* (2013.01);
(Continued)

(58) Field of Classification Search
CPC ...... H05K 1/0271; H05K 1/024; H05K 1/185; H01L 21/481; H01L 21/4857; H01L 23/3121; H01L 23/49894
See application file for complete search history.

(56) References Cited

U.S. PATENT DOCUMENTS

| 5,945,203 A | 8/1999 | Soane |
|---|---|---|
| 7,183,135 B2 | 2/2007 | Kosemura et al. |
| (Continued) | | |

FOREIGN PATENT DOCUMENTS

| CN | 109637981 A | 4/2019 |
|---|---|---|
| JP | 2013179189 A | 9/2013 |
| (Continued) | | |

OTHER PUBLICATIONS

Goethals, F.; Communication in Application No. 20 216 137.8 in the European Patent Office; pp. 1-8; dated Apr. 19, 2021; European Patent Office; Postbus 5818, 2280 HV Rijswijk, Netherlands.
(Continued)

*Primary Examiner* — Hoa C Nguyen
(74) *Attorney, Agent, or Firm* — Robert A. Blaha; Smith Tempel Blaha LLC

(57) ABSTRACT

A component carrier includes a stack having at least one electrically conductive layer structure, a first electrically insulating layer structure and a second electrically insulating layer structure. The first electrically insulating layer structure is made of a material which has first physical properties. The second electrically insulating layer structure is made of another material which has second physical properties differing from the first physical properties. The first electrically insulating layer structure and the second electrically insulating layer structure are at least partially in direct physical contact with each other. A method of manufacturing a component carrier is also disclosed.

20 Claims, 3 Drawing Sheets

(51) Int. Cl.
*H01L 21/48* (2006.01)
*H01L 23/31* (2006.01)
*H01L 23/498* (2006.01)

(52) U.S. Cl.
CPC .... *H01L 23/3121* (2013.01); *H01L 23/49894* (2013.01); *H05K 1/024* (2013.01); *H05K 1/185* (2013.01)

(56) References Cited

U.S. PATENT DOCUMENTS

| | | |
|---|---|---|
| 9,215,805 B2 | 12/2015 | Furutani et al. |
| 2005/0037535 A1 | 2/2005 | Kosemura et al. |
| 2008/0237884 A1 | 10/2008 | Hsu |
| 2011/0024172 A1 | 2/2011 | Kawaguchi et al. |
| 2011/0259630 A1 | 10/2011 | Park |
| 2012/0133052 A1* | 5/2012 | Kikuchi ............... H01L 24/24 257/774 |
| 2013/0284506 A1 | 10/2013 | Furutani |
| 2014/0153205 A1 | 6/2014 | Furutani et al. |
| 2014/0182889 A1* | 7/2014 | Shin .................. H05K 3/4673 174/251 |
| 2014/0367147 A1 | 12/2014 | Lee et al. |
| 2015/0076714 A1 | 3/2015 | Crisp et al. |
| 2016/0219711 A1* | 7/2016 | Lee ..................... H05K 1/186 |
| 2016/0338195 A1 | 11/2016 | Ikeda |
| 2018/0213647 A1 | 7/2018 | Gavagnin et al. |
| 2018/0247834 A1 | 8/2018 | Fujii et al. |
| 2019/0027419 A1 | 1/2019 | Jung et al. |
| 2020/0045825 A1* | 2/2020 | Wu ...................... H05K 1/185 |
| 2020/0163223 A1 | 5/2020 | Mok et al. |

FOREIGN PATENT DOCUMENTS

| | | |
|---|---|---|
| JP | 2015225936 A | 12/2015 |
| JP | 2018186121 A | 11/2018 |
| WO | 9920089 A1 | 4/1999 |
| WO | 2010101167 A1 | 9/2010 |
| WO | 2012133839 A1 | 10/2012 |

OTHER PUBLICATIONS

Goethals, F.; Partial European Search Report in Application No. 20 216 137.8 in the European Patent Office; pp. 1-22; dated Aug. 20, 2021; European Patent Office; 80298, Munich, Germany.

Unknown, "Reduction of Solder Crack/Low Elastic Modulus Material TD-002(Prepreg)", pp. 1-2; May 2, 2017 (May 2, 2017), retrieved from https://www.mc.showadenko.com/english/products/bm/files/td_002.pdf.

Goethals, F.; Extended European Search Report in Application 20216137.8; pp. 1-21; dated Dec. 14, 2021; European Patent Office; 80298 Munich, Germany.

* cited by examiner

COMPONENT CARRIER AND METHOD OF MANUFACTURING A COMPONENT CARRIER

CROSS-REFERENCE TO RELATED APPLICATIONS

This application claims the benefit of the filing date of the Chinese Patent Application No. 201911412393.6, filed Dec. 31, 2019, the disclosure of which is hereby incorporated herein by reference.

TECHNICAL FIELD

The disclosure relates to a component carrier and to a method of manufacturing a component carrier.

BACKGROUND

In the context of growing product functionalities of component carriers equipped with one or more electronic components and increasing miniaturization of such components as well as a rising number of components to be mounted on the component carriers such as printed circuit boards, increasingly more powerful array-like components or packages having several components are being employed, which have a plurality of contacts or connections, with ever smaller spacing between these contacts. Removal of heat generated by such components and the component carrier itself during operation becomes an increasing issue. At the same time, component carriers shall be mechanically robust and electrically reliable so as to be operable even under harsh conditions.

A shortcoming with laminated component carriers is that they may be suffer from artefacts such as warpage.

SUMMARY

There may be a need to provide a component carrier being properly protected from artefacts such as warpage.

According to an exemplary embodiment of the invention, a component carrier is provided which comprises at least one electrically conductive layer structure, a first electrically insulating layer structure and a second electrically insulating layer structure, wherein the first electrically insulating layer structure is made of a material which has first physical properties, wherein the second electrically insulating layer structure is made of another material which has second physical properties differing from the first physical properties, and wherein the first electrically insulating layer structure and the second electrically insulating layer structure are at least partially (i.e. only partially or completely) in direct physical contact with each other.

According to another exemplary embodiment of the invention, a method of manufacturing a component carrier is provided, wherein the method comprises forming (in particular laminating) a stack comprising at least one electrically conductive layer structure, a first electrically insulating layer structure and a second electrically insulating layer structure, configuring the first electrically insulating layer structure of a material having first physical properties, configuring the second electrically insulating layer structure of another material having second physical properties differing from the first physical properties, and arranging the first electrically insulating layer structure and the second electrically insulating layer structure at least partially (i.e. only partially or completely) in direct physical contact with each other.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "stack" may particularly denote an arrangement of multiple planar layer structures which are mounted in parallel on top of one another.

In the context of the present application, the term "layer structure" may particularly denote a continuous layer, a patterned layer or a plurality of non-consecutive islands within a common plane.

In the context of the present application, the term "laminating" may particularly denote connecting layer structures, such as layers, by the application of mechanical pressure and/or heat.

In the context of the present application, the term "physical properties" of the electrically insulating layer structures may particularly denote any property of the respective electrically insulating layer structure which has an impact on the function of said electrically insulating layer structure within the stack, in particular within the component carrier. Examples for physical properties are shrinkage behavior during curing, coefficient of thermal expansion, Young modulus, thermal conductivity, loss factor or dissipation factor in terms of transmitting high-frequency signals, flowability properties in terms of curing during lamination, etc. Such electrically insulating layer structures with different physical properties may be directly connected with each other by lamination.

According to an exemplary embodiment of the invention, a component carrier is provided which has a stack with at least two different electrically insulating layer structures made of different materials and consequently having different physical properties. Said different electrically insulating layer structures may be at least partially in direct physical contact with each other, i.e., may be directly connected by lamination with each other so that a direct interface or material bridge between said electrically insulating layer structures is created. By adjusting the physical properties of the directly connected different material dielectric layer structures of the stack, properties of the obtained component carrier may be precisely adjusted or controlled. In other words, the materials of the different electrically insulating layer structures may be used as design parameters for adjusting the behavior of the component carrier. The behavior of the component carrier for instance in terms of warpage, heat removal capability, high-frequency capability, mechanical robustness and electrical reliability can be properly adjusted by taking this measure. Thus, different dielectric materials with different properties (for instance different properties in terms of curing shrinkage value, value of the Young modulus, value of the coefficient of thermal expansion, value of the thermal conductivity, flowability during curing, etc.) may be directly connected with each other, for instance may be pressed together during lamination.

In the following, further exemplary embodiments of the method and the component carrier will be explained.

In an embodiment, one (in particular exactly one) of the first electrically insulating layer structure and the second electrically insulating layer structure is made of a low Young modulus material. In the context of the present application, the term "Young modulus" may particularly denote the elastic modulus, i.e., a measure of the stiffness of a solid material and defines the relationship between stress (force per unit area) and strain (proportional deformation) in a material. A softer material has a smaller value of the Young modulus than a more rigid material. In particular, the low Young modulus material of the respective electrically insulating layer structure may have a value of the Young modulus below 3 GPa, in particular below 1 GPa. Such a material may serve as a mechanical buffer structure, i.e., as a mechanically relatively flexible or elastic electrically insulating structure. This may render said material highly appropriate for (in particular directly) surrounding an embedded component of the component carrier. Such a mechanical buffer structure may have a locally reduced value of the Young modulus and may therefore function as a mechanically damping or force balancing structure, for instance in the event of bending stress. As a result, such a low Young modulus material may also suppress warpage.

In an embodiment, one (in particular exactly one) of the first electrically insulating layer structure and the second electrically insulating layer structure is made of a high Young modulus material. In particular, the high Young modulus material may have a value of the Young modulus above 3 GPa, in particular above 5 GPa, more particularly above 8 GPa, for instance above 12 GPa. Highly advantageously, it has turned out that in particular when one of the electrically insulating layer structures is made of a low Young modulus material, the other electrically insulating layer structure does not necessarily have to be a low Young modulus material. Thus, said other material does not have to be soft, but may have a relatively high value of the Young modulus and may thereby contribute to the rigidity of the component carrier. Moreover, the fact that a low Young modulus property of said material is dispensable, any additional effort connected with the provision of the low Young modulus dielectric is small. This allows manufacturing the component carrier in a simple and efficient way.

In an embodiment, one (in particular exactly one) of the first electrically insulating layer structure and the second electrically insulating layer structure is made of a low loss material having low loss for high frequencies. In particular, the low loss material (which may be a low dk material) may have a loss factor (which may also be denoted as dissipation factor) of not more than 0.004 at a frequency of 1 GHz. The respective electrically insulating layer structure may thus comprise a high-frequency dielectric. In the context of the present application, the term "high-frequency dielectric" may particularly denote an electrically insulating material which has low loss properties when a high-frequency or radio-frequency signal propagates along and/or in the component carrier in the direct environment of the high-frequency dielectric. In particular, the high-frequency dielectric may have a lower loss than standard prepreg material of a stack of component carrier material. As an example, RO3003™ material, as commercialized by the company Rogers Corporation, can be used as high-frequency dielectric. For instance, high-frequency dielectric material may have a dissipation factor of not more than 0.004, in particular of not more than 0.003, more particularly not more than 0.0015, at 10 GHz. The mentioned high frequency circuit materials may be for example ceramic-filled PTFE (polytetrafluoroethylene) composites. By providing part of the electrically insulating layer structures of a high-frequency dielectric, a low loss transport of even high-frequency signals is enabled. It is also possible that the high-frequency dielectric is a high-frequency capable prepreg, FR4 or ABF material. Such a high-frequency dielectric material may have a relative permeability Er in a range between 1.01 and 4. In a stack, one or more electrically insulating layer structures may be configured as a high-frequency dielectric.

In an embodiment, one (in particular exactly one) of the first electrically insulating layer structure and the second electrically insulating layer structure is made of a low shrinkage material having a curing shrinkage value of less than 1%, in particular less than 0.5%, more particularly less than 0.2%. In the context of the present application, the term "curing shrinkage value" may particularly denote a ratio between, on the one hand, a difference between a dimension (in particular a length) of a (in particular layer-type) material in an uncured condition and a dimension (in particular a length) of the material in a cured condition, and, on the other hand, said dimension in the uncured condition. Thus, the curing shrinkage value may be in particular indicative of a length reduction of said dielectric material upon curing. The material may comprise a resin (in particular an organic resin such as epoxy resin) which may be initially, i.e., before lamination to the layer stack, in an uncured condition. This means that the material in the uncured condition may still be capable of being laminated by the application of pressure and/or heat. During lamination, the uncured material may become flowable, may start cross-linking or polymerization, and may then be re-solidified at the end of the curing procedure in a cured condition. Curing may thus relate to the curing during lamination of said material. In an embodiment, the low shrinkage material may be a curable resin composition comprising at least one polyol selected from the group consisting of polybutadiene polyol, polybutadiene polyol or polyester polyol, and at least one polyblock isocyanate (such as polybutadiene polyblock isocyanate). Such resin materials show a low shrinkage behavior upon curing. Implementing such a material as a laminate in a laminated stack of a component carrier may strongly suppress warpage of the multi-layer component carrier, such as a printed circuit board. In an embodiment, the low shrinkage material may be GX92™ available from the Ajinomoto Co., Inc. of Tokyo, Japan. According to such an exemplary embodiment, the component carrier (such as a printed circuit board) having a preferably laminated (i.e., connected by pressure and/or heat) layer stack may include a dielectric material with a low curing shrinkage value of less than 1%. Thus, the relative length reduction of said material upon curing may be less than 0.01. Highly advantageously, the behavior of said material to shrink only in a very moderate way by curing during lamination of the stack has turned out to significantly reduce warpage of the stack on panel level as well as of the readily manufactured component carrier. Conventionally, warpage may result in an undesired bending of the plate-shaped component carrier, which may cause secondary problems such as inaccuracies of constituents of the component carrier structure, a tendency of delamination and the presence of stress. It is believed that the inclusion of the low curing shrinkage dielectric in the layer stack keeps lamination-caused interior bonding forces small which may result conventionally in warpage. Suppressing or even completely eliminating the tendency of the component carrier to warp may significantly improve reliability of the component carrier. Since shrinkage of resin material during curing involves stress, it is considered as a significant source of warpage. By reducing shrinkage and therefore material migration and stress creation during curing, also warpage may be reduced.

In an embodiment, the low shrinkage material is a high modulus material. A softer material has a smaller value of the Young modulus than a more rigid material. Highly advantageously, it has turned out that said material having a low shrinkage behavior does not necessarily have to be a low Young modulus material. Thus, said material does not have to be soft, but may contribute to the rigidity of the component carrier. Moreover, the fact that a low Young modulus property of said low curing shrinkage material is dispensable, the effort connected with the provision of the low curing shrinkage dielectric is small. This allows manufacturing the component carrier in a simple and efficient way.

In an embodiment, the other one of the first electrically insulating layer structure and the second electrically insulating layer structure, which is not made of the low curing shrinkage material, is made of a material having a higher curing shrinkage value than the low shrinkage material. Instead of having low curing shrinkage behavior, such a dielectric material may be adjusted to have other advantageous properties which low curing shrinkage materials sometimes do not have. For instance, the higher curing shrinkage value material may be a soft dielectric material, i.e., may have a value of the Young modulus being smaller than the value of the Young modulus of the low curing shrinkage material.

In an embodiment, the higher curing shrinkage value is more than 1%, in particular more than 2%. Advantageously, it may be possible to configure the other material with a relatively high curing shrinkage value, since the low curing shrinkage value of the material may be sufficient for suppressing warpage of the overall component carrier in an efficient manner. At the same time, the material properties of the other dielectric material may be freely selected for optimizing the overall behavior of the component carrier. Since it may be dispensable to configure the other material of low curing shrinkage material, the other material may be provided with reasonable effort.

In an embodiment, one (in particular exactly one) of the first electrically insulating layer structure and the second electrically insulating layer structure is made of a highly thermally conductive material. In particular, the highly thermally conductive material may have a thermal conductivity of at least 1 W/mK, in particular at least 2 W/mK. Such a material may contribute to remove heat out of the component carrier during operation, for instance to remove or spread heat generated by an embedded component such as a semiconductor chip. The heat removal capability of such a material may be better than that of conventional prepreg.

In an embodiment, one (in particular exactly one) of the first electrically insulating layer structure and the second electrically insulating layer structure is made of a high flow material. In the context of the present application, the term "high flow material" may particularly denote a dielectric material which is capable of becoming highly flowable and with a low viscosity during lamination, i.e., with the application of heat and/or pressure. A high flow material may thus have a specifically pronounced property of flowing, i.e., the material may have a low viscosity. Thus, such material may have the probability of flowing into tiny gaps in an interior of the stack during lamination, for instance in an environment of an embedded component. Undesired voids resulting in disturbing properties such as warpage may therefore be prevented. In contrast to said high flow material, another electrically insulating layer structure may have low flow properties, for instance may be low-flow prepreg or no flow prepreg.

In an embodiment, the component carrier comprises a component embedded in the stack. In the context of the present application, the term "component" may particularly denote an inlay-type member. Such a component may be arranged in an interior of the stack. A component may in particular have an electronic function and may thus be a heat source in view of ohmic losses. For instance, such a component may be a semiconductor die. Embedding a component, for instance a semiconductor die, in a component carrier stack, which may comprise copper, organic resin and optionally glass particles, may create particularly pronounced warpage issues. It is believed that this results from the very different materials which a component and the stack may have. Thus, the provision of electrically insulating layer structures of different materials (for instance one being a low curing shrinkage dielectric, and the other one being a low Young modulus material, as described above) in the stack may have particularly pronounced advantages in the presence of an embedded component.

In an embodiment, the second electrically insulating layer structure directly surrounds at least part of the component, i.e., surrounds the component partially or entirely. In such an embodiment, the first electrically insulating layer structure may be further away from the embedded component. When directly contacting the embedded component along at least part of its circumference, the material of the second electrically insulating layer structure may be advantageously configured for specifically protecting the embedded components from damage. For instance, the second electrically insulating layer structure may be made of a soft material having a low Young modulus, for instance less than 3 GPa. Descriptively speaking, such a soft environment of the embedded component may serve as a mechanical buffer. Additionally or alternatively, it is also possible that the electrically insulating material directly surrounding the embedded component has a high thermal conductivity, in particular at least 2 W/mK, for efficiently removing and/or spreading heat created by the embedded component (for instance a semi-conductor chip) during operation of the component carrier.

In an embodiment, the second electrically insulating layer structure has a shell at least partially surrounding the component, and the first electrically insulating layer structure has two opposing layers sandwiching the component and the second electrically insulating layer structure and extending laterally beyond all sidewalls of the component and/or extending laterally beyond the shell. It has turned out that this arrangement with a shell directly surrounding an embedded component and laterally extended outer layer structures can be properly designed for suppressing warpage and mechanically protecting the embedded component.

In an embodiment, the shell surrounds all sidewalls of the component and only one or both of two opposing main surfaces of the component. In such an embodiment, all four sidewalls in a cross-sectional view of the component carrier are surrounded by the respective electrically insulating layer structure. Three-dimensionally, the entire surface of the embedded component may be surrounded by said dielectric material.

In an embodiment, the component carrier is configured as coreless component carrier. In the context of the present application, the term "coreless" may particularly denote a component carrier which does not comprise a core in a central portion thereof. A core may for example be a (in particular single) thick dielectric central plate being already fully cured when starting to form a build-up on both opposing main surfaces thereof. However, the concept of multiple directly connected electrically insulating layer structures with different physical properties may also be applied to a configuration with a plurality of directly connected dielectric layers made of different materials and substituting a core.

In an embodiment, the component carrier is configured as a rigid component carrier. In the context of the present application, the term "rigid component carrier" may particularly denote a component carrier which, when applying or exerting ordinary forces typically occurring during operation of the component carrier, will remain substantially undeformed. In other words, the shape of the rigid component carrier will not be changed when applying forces occurring typically during operation of the component carrier. In particular, the component carrier may be a rigid component carrier with low warpage behavior.

In an embodiment, the first electrically insulating layer structure and the second electrically insulating layer structure are in direct physical contact with each other without any electrically conductive material in between. In such an alternative, the mentioned electrically insulating layer structures may be directly connected with each other over their full connection surfaces, and in particular without any copper separating said electrically insulating layer structures from each other. This may allow keeping the number of material bridges within the component carrier small.

In another alternative, the mentioned electrically insulating layer structures may be directly connected with each other with physical contact over only a part of their connection surfaces, but with yet another material (in particular an electrically conductive material such as copper) separating said electrically insulating layer structures from each other partially.

In an embodiment, at least one of the first and the second electrically insulating layer structures with different physical properties (for instance one being a low curing shrinkage material, and the other one being a low Young modulus material) is functionalized. For instance, the functionalization may relate to a high thermal conductivity function, a low loss at high frequency function, and/or a high flow function. For instance, such a functionalization may be achieved by adding filler particles to the respective electrically insulating layer structure. Thus, the respective dielectric may comprise filler particles so as to adjust the physical properties of the component carrier. For example, such filler particles may at least partially equilibrate a mismatch between the coefficients of thermal expansion of the various materials of the stack (in particular copper and resin, optionally comprising reinforcing particles such as glass fibers). It is also possible that the filler particles are functionalized in another way, for instance to increase the thermal conductivity of the component carrier. The filler particles may also be selected so as to improve the high frequency performance of the component carrier, for instance may be made of a low dk material.

In an embodiment, at least one of the first and the second electrically insulating layer structures with different physical properties forms an outer layer (in particular an outermost layer) of the stack. In particular, the first or the second electrically insulating layer structures with different physical properties may form two opposing outer layers (in particular outermost layers) of the stack. One or both opposing main surfaces of the stack may thus be formed by a dielectric with selectively adjusted physical properties, for instance with low curing shrinkage value. Experiments have shown that in particular the outermost layer structures of the stack have a strong impact on the warpage behavior, so that their provision from a low shrinkage value dielectric may have a specifically pronounced impact on warpage suppression.

In an embodiment, the ratio between a length of the embedded component (in particular a semiconductor chip) and a length of the component carrier (for example a printed circuit board) is at least 30%, in particular at least 40%. In particular in the event of the mentioned high die-to-board ratios, issues with warpage of a component carrier with embedded component are particularly pronounced. Thus, the provision of a low curing shrinkage dielectric material as one of the first and the second electrically insulating layer structures is of utmost advantage in such a scenario.

In an embodiment, the curing shrinkage value of a material of the first electrically insulating layer structure or the second electrically insulating layer structure (or of any other material, for instance a low curing shrinkage material) is measured by connecting a layer of said material in an uncured condition and with an initial length "A" on a base, curing said layer, determining a length "a" of the cured layer in a cured condition of said material, and calculating the curing shrinkage value as:

$$(A-a)/A.$$

It goes without saying that the curing shrinkage value of any other material may be determined in the same way.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through holes through the laminate, for instance by laser drilling or mechanical drilling, and by filling them with electrically conductive material (in particular copper), thereby forming vias as through hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Size Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imageable or dry-etchable organic material like epoxy-based build-up material (such as epoxy-based build-up film) or polymer compounds like polyimide, polybenzoxazole, or benzocyclobutene-functionalized polymers.

In an embodiment, at least one of the first and the second electrically insulating layer structures comprises at least one of the group consisting of resin (such as reinforced or non-reinforced resins, for instance epoxy resin or bismaleimide-triazine resin), cyanate ester resins, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (PTFE, Teflon®), a ceramic, and a metal oxide. Teflon® is a registered mark of The Chemours Company FC LLC of Wilmington, Del., U.S.A. Reinforcing structures such as webs, fibers or spheres, for example made of glass (multi-layer glass) may be used as well. Although prepreg particularly FR4 are usually preferred for rigid PCBs, other materials in particular epoxy-based build-up film or photo-imageable dielectric material may be used as well. For high frequency applications, high-frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

At least one component, which can be optionally surface mounted on and/or embedded in the stack, can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an optical element (for instance a lens), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, may be used as component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such as solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), gold (in particular Hard Gold), chemical tin, nickel-gold, nickel-palladium, Electroless Nickel Immersion Palladium Immersion Gold (ENIPIG), etc.

The aspects defined above and further aspects of the invention are apparent from the examples of embodiment to be described hereinafter and are explained with reference to these examples of embodiment.

DETAILED DESCRIPTION OF EXEMPLARY EMBODIMENTS

Figure 1:
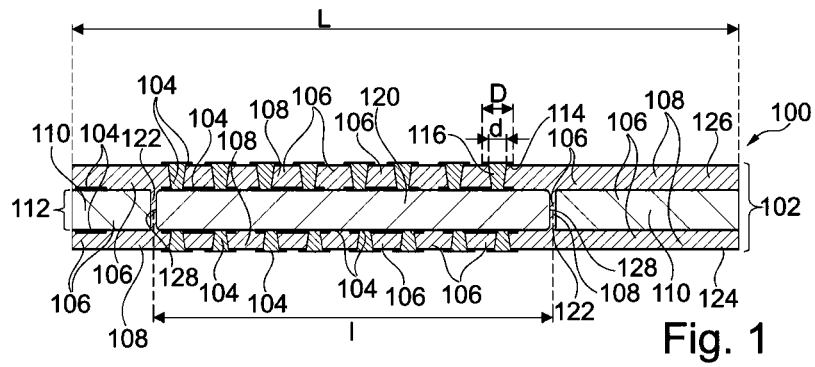
FIG. 1 illustrates a cross-sectional view of a component carrier according to an exemplary embodiment of the invention.

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

According to exemplary embodiments of the invention, a component carrier is provided enabling electronic component packaging within a laminate with a (preferably symmetrical) two (or more) dielectric material layer configuration. More generally, such a concept may also be implemented without embedding an electronic component. A gist of an exemplary embodiment of the invention is to create a component carrier manufacture for proper control of the physical properties, in particular in case of an embedded package. According to such a concept, different electrically insulating layer structures with different physical properties are connected at least partially directly with each other to thereby provide at least two different functionalities. In particular, this may allow to obtain a warpage improvement, but other exemplary embodiments can be utilized for obtaining other physical properties and thus component carrier properties. In particular, an exemplary embodiment of the invention provides a component carrier in which one or more electronic components are embedded in a printed circuit board (PCB) package system completely or partially by utilizing a preferably symmetrical multi-dielectric layer embedding concept. In particular, a build-up of layer structures on two opposing main surfaces of a central core (in which a component may be embedded) may be symmetrical, while at least two different dielectric materials with different physical properties may be implemented in the layer stack for refining the functionality, quality or reliability of the component carrier.

In one embodiment, an embedded component may be encapsulated from all sides (four in a cross-sectional view) in a symmetrical manner by a first dielectric material of a laminated layer stack. After encapsulation of the component is completed, an additional second dielectric material may be laminated on the stack or board. The provision of at least two electrically insulating layer structures in direct physical contact with each other and having different physical properties may be advantageous to give flexibility, for instance for one or more of the following purposes:

Warpage improvement, for example obtained by the combination of a low modulus dielectric material with a high modulus dielectric material;

Improvement due to low Dk/Df combination, for example by a combination of a high flow dielectric material with a low Dk/Df material. For instance, one of the electrically insulating layer structures may be a low Dk material for obtaining a low loss high-frequency behaviour, whereas another one of the electrically insulating layer structures may experience a high flow behaviour during lamination;

Heat dissipation improvement, for instance by a combination of a high flow material with a high heat dissipation material.

Advantageously, an exemplary embodiment of the invention provides a technology concept for adjusting properties of a component carrier, in particular for packaging embedding applications. An exemplary embodiment of the invention provides an easy to implement technology concept which can be carried out with existing technology.

Another exemplary embodiment of the invention provides an electronic component packaging architecture with a low Young modulus buffer layer and a higher Young modulus stabilization layer. By taking this measure, it may be possible to overcome issues with warpage of component carriers. To counter this type of issues, an exemplary embodiment uses dedicated types of dielectric materials to reduce the warpage and enable lower warpage performance packaging. In particular, one or more electronic components may be embedded into a PCB stack completely or partially, for instance by utilizing a low modulus buffer layer concept, preferably but not necessarily in combination with another low curing shrinkage layer.

In one embodiment, a component may be encapsulated from only a part of its sides (for example three in a cross-sectional view) by a low modulus material, wherein the Young modulus value may be in particular smaller than 3 GPa (more specifically smaller than 1 GPa). After that, the stack up may be stabilized by utilizing a high or higher Young modulus material with a Young modulus value larger than 3 GPa (more specifically larger than 8 GPa) and preferably having a curing shrinkage value of less than 1% (more specifically less than 0.5%).

In another embodiment, a component may be encapsulated from all sides (four in a cross-sectional view) by a low Young modulus material, wherein the Young modulus value may be smaller than 3 GPa (more specifically smaller than 1 GPa). After that, the stack up may be stabilized by utilizing a higher or high modulus material with a Young modulus value larger than 3 GPa (more specifically larger than 8 GPa) which may have a curing shrinkage value of less than 1% (more specifically less than 0.5%).

Such embodiments may allow obtaining a component carrier being mechanically and/or thermally stable even in case of a high-die-to-package ratio. Embodiments of the invention may be particularly advantageous in terms of fan-out packaging.

In another embodiment, an ultra-low warpage PCB with low modulus stabilization layer is provided. In particular, it may be possible to insert a low modulus stabilization layer into the stack up. Based on experimental test results, this may result in an improved warpage performance. Descriptively speaking, a PCB stack up may be modified by adding at least one low modulus stabilization layer in the stack up. The additional layer can be inserted for example in the core and/or any of the build-up layers. It can comprise or consist of a complete dielectric or part of the dielectric. The low modulus layer may have a value of the Young modulus of less than 10 GPa, in particular less than 5 GPa, preferably less than 1 GPa. This may allow to obtain a significantly improved warpage performance with a modification of the layer structure. Advantageously, it may be possible to reach critical benefits to be able to offer an ultra-low modulus stack up.

FIG. 1 illustrates a cross-sectional view of a rigid component carrier 100 according to an exemplary embodiment of the invention.

According to FIG. 1, the laminate-type component carrier 100 is provided which may be configured as a plate-shaped PCB (printed circuit board) or IC (integrated circuit) substrate. The component carrier 100 comprises a laminated stack 102 comprising electrically conductive layer structures 104 and electrically insulating layer structures 106. Lamination may particularly denote the connection of the layer structures 104, 106 by the application of pressure and/or heat. For example, the electrically conductive layer structures 104 may comprise patterned copper foils and vertical through-connections, for example copper filled laser vias. The electrically insulating layer structures 106 may comprise a respective resin (such as a respective epoxy resin), optionally comprising reinforcing particles therein (for instance glass fibers or glass spheres). For instance, a part of the electrically insulating layer structures 106 (with the exception of first electrically insulating layer structure 108, as described below) may be made of prepreg or FR4.

In the shown embodiment, the first electrically insulating layer structure 108 of the electrically insulating layer structures 106 is made of a material which has first physical properties, more precisely is configured as a low curing shrinkage dielectric (as described below in further detail). A second electrically insulating layer structure 110 of the electrically insulating layer structures 106 is made of another material which has second physical properties differing from the first physical properties. For instance, the second electrically insulating layer structure 110 may be made of a low Young modulus material (as described below in further detail) or may be made of ordinary prepreg. As shown, the first electrically insulating layer structure 108 and the second electrically insulating layer structure 110 are partially in direct physical contact with each other, and are partially separated from each other by the electrically conductive layer structures 104 of core 112.

As already mentioned, the first electrically insulating layer structure 108 has a low curing shrinkage value, for instance a low curing shrinkage value of less than 0.5%. This means that a length, L, of the layer-shaped first electrically insulating layer structure 108 may be reduced by less than 0.5% during curing while being laminated on the stack 102. Details will be described below referring to FIG. 2 to FIG. 6. In particular, such a curing shrinkage value may be adjusted by correspondingly setting the properties of the resin of first electrically insulating layer structure 108. For instance, the low shrinkage material of the first electrically insulating layer structure 108 may be ABF® material GX92™ available from the Ajinomoto Co., Inc. of Tokyo, Japan. When laminating stack 102 by the application of heat and/or pressure, the low shrinkage material-based first electrically insulating layer structure 108 will undergo curing which reduces the length, L, of the first electrically insulating layer structure 108 by less than 0.5% (compare FIG. 2 to FIG. 6 illustrating a process of measuring curing shrinkage). This has the advantage that the tendency of the readily manufactured component carrier 100 of showing warpage can be significantly reduced.

Further advantageously, said first electrically insulating layer structure 108 with low curing shrinkage properties may have a value of the Young modulus above 8 GPa, i.e., may be relatively rigid. This promotes rigidity of the component carrier 100 as a whole. In view of its low curing shrinkage behavior, it is thus not necessary (although possible in other embodiments) that first electrically insulating layer structure 108 additionally shows a low Young modulus behavior. It is believed that the strong suppression of warpage renders it dispensable to provide a specifically soft material in the stack 102.

Alternatively, said first electrically insulating layer structure 108 with low curing shrinkage behavior may have a value of the Young modulus of not more than 5 GPa, i.e., may be relatively soft. In such an embodiment the first electrically insulating layer structure 108 may simultaneously function as a mechanical buffer, in particular protecting an embedded component 120 described below.

Central core 112 of the stack 102 comprises a fully cured dielectric (such as FR4) and forms the abovementioned second electrically insulating layer structure 110. On both opposing main surfaces of the fully cured dielectric, a respective patterned copper layer may be provided as electrically conductive layer structure 104. In an embodiment, it is possible that the core 112 is provided with a material having a low coefficient of thermal expansion (CTE) value of less than 15 ppm/K. This may reduce thermal stress in an interior of stack 102 when heating or cooling the component carrier 100. As mentioned above, the second electrically insulating layer structure 110 forming part of core 112 may or may not be made of a low Young modulus material (for instance may have a value of the Young modulus of below 3 GPa, in particular below 1 GPa). The second electrically insulating layer structure 110 has physical properties being different from those of the first electrically insulating layer structure 108.

In the shown embodiment, the first electrically insulating layer structure 108 with low curing shrinkage behavior forms two opposing outer layers of the stack 102 sandwiching core 112 and embedded component 120. More specifically, the low curing shrinkage-type first electrically insulating layer structure 108 circumferentially surrounds embedded component 120 with a shell 122 and layers 124, 126.

The component 120 is embedded in the stack 102 and is circumferentially completely surrounded by the low curing shrinkage-type first electrically insulating layer structure 108 as well as of material of the electrically conductive layer structures 104 providing an exterior electrical access to the embedded component 120. For example, the embedded component 120 is a semiconductor chip. As shown, the low curing shrinkage-type first electrically insulating layer structure 108 directly surrounds the component 120, so that the dielectric low curing shrinkage-type first electrically insulating layer structure 108 is in physical contact with the embedded component 120. As already mentioned, said low curing shrinkage-type first electrically insulating layer structure 108 has shell 122 surrounding the component 120 and has two opposing layers 124, 126 sandwiching the component 120 and the surrounding shell 122 and extending laterally beyond all sidewalls 128 of the component 120, for instance up to the exterior edges of the component carrier 100. The embedding of the component 120 within low curing shrinkage dielectric significantly contributes to the warpage suppression of the component carrier 100 shown in FIG. 1.

As shown in FIG. 1 as well, a ratio between a length, l, of the embedded component 120 and a length L of the component carrier 100 may be more than 50%. Thus, component carrier 100 has a high die-to-package ratio and is thus particularly prone to warpage. Thanks to the low curing shrinkage-type first electrically insulating layer structure 108, the tendency of the component carrier 102 to warp may be significantly reduced.

Due to the efficient suppression of warpage, the mechanical reliability of the component carrier 100 as well as the accuracy of the positioning of the various constituents thereof (in particular of the electrically conductive layer structures 104 and their substructures) may be high. As shown, the electrically conductive layer structures 104 comprise copper pads 114 each connected to a respective copper plated via 116. A respective pad 114 has a larger size or diameter, D, than the maximum size or diameter, d, of the via 116 to balance out tolerances and inaccuracies (for instance when an electrically conductive trace, not shown in FIG. 1, is to be connected to pad 114). More specifically, a ratio between diameter, D, of a respective pad 114 and maximum diameter, d, of an assigned plated via 116 may be less than 2. This small pad size, which may result in a compact configuration of the component carrier 100, is a consequence of the high positional accuracy of the substructures of the electrically conductive layer structure 104 thanks to the strong warpage suppression caused by low curing shrinkage-type first electrically insulating layer structure 108.

Although not shown explicitly, it may be possible that the component carrier 100 according to FIG. 1 has an electrically conductive layer structure 104 which comprises a landless plated via 116, i.e., a via 116 having no pad at all (for instance being directly connected to an electrically conductive trace, not shown, without pad). In view of the significantly improved registration accuracy due to the strong suppression of warpage, small pad sizes or even padless configurations may be made possible.

The embodiment of FIG. 1 shows embedded component 120 being substantially completely encapsulated within low shrinkage-type first electrically insulating layer structure 108 at a top side, a bottom side and being surrounded also along sidewalls 128. This ensures a particularly strong suppression of warpage.

As already mentioned, the second electrically conductive layer structure 110 may have different physical properties than the first electrically insulating layer structure 108. Thus, the second electrically conductive layer structure 110 may be specifically configured to fulfill another function within the component carrier 100 than the first electrically insulating layer structure 108. For example, the second electrically insulating layer structure 110 may be made of a rigid material protecting component 120 during an embedding process. Alternatively, the second electrically insulating layer structure 110 may be a low Young modulus material providing soft properties to the component carrier 100 as a whole, thereby further reducing mechanical load. The materials of the electrically insulating layer structures 108, 110 may synergistically cooperate for suppressing warpage.

FIG. 2 to FIG. 6 illustrate cross-sectional views of structures obtained during carrying out a method of determining a curing shrinkage value of a material of an electrically insulating layer structure 106, in particular of the above-described first electrically insulating layer structure 108 or the second electrically insulating layer structure 110, to be used for manufacturing a component carrier 100 according to exemplary embodiments of the invention. Thus, it will be described in the following referring to FIG. 2 to FIG. 6 how the curing shrinkage value (0.5% according to first electrically insulating layer structure 108 of FIG. 1) can be measured. A measurement of the curing shrinkage value for any other material may be carried out accordingly.

Figure 2:
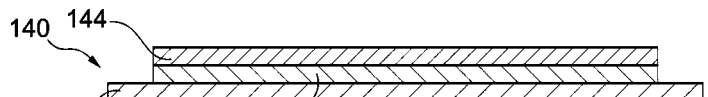
FIG. 2, FIG. 3, FIG. 4, FIG. 5 and FIG. 6 illustrate cross-sectional views of structures obtained during carrying out a method of determining a curing shrinkage value of an electrically insulating layer structure to be used for manufacturing a component carrier according to an exemplary embodiment of the invention.

Referring to FIG. 2, a (for instance laminated) layer stack 140 is shown which is composed of a bottom layer 142 (for instance made of polyimide, PI) covered by an uncured layer of first electrically insulating layer structure 108' (which will be converted into above-described first electrically insulating layer structure 108 during curing) being covered, in turn, by a protection layer 144 (for instance polyethylene terephthalate, PET).

Figure 3:
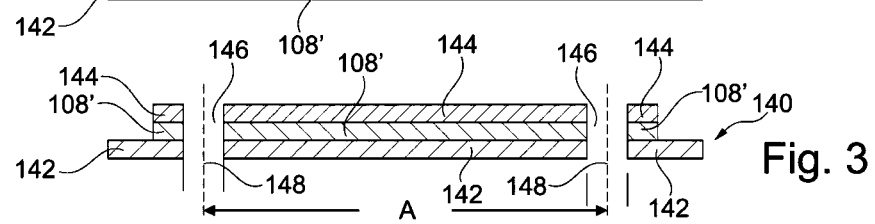

Referring to FIG. 3, holes 146 may be formed in the layer stack 140 to thereby delimit in between a planar portion of the layer stack 140 with defined initial length "A". Length "A" of uncured first electrically insulating layer structure 108' is measured between centers 148 of the holes 146.

Figure 4:
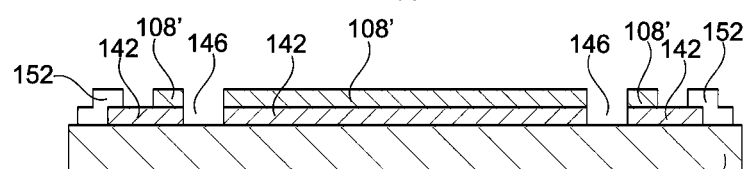

Referring to FIG. 4, the layer of said first electrically insulating layer structure 108' of said initial length "A" is attached to a plate-type base 150 in an uncured condition with bottom layer 142 in between. In other words, the uncured first electrically insulating layer structure 108' is set on base 150, embodied as a back board, and is fixed there. Protection layer 144 may be removed from layer stack 140, for instance by peeling it off. Edge portions of the layers 142, 108' outside of the holes 146 may be fixed with a fixing structure 152, for instance polyimide tape (which may be adhesive).

Figure 5:
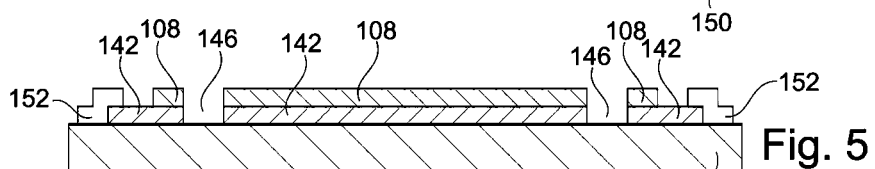

Referring to FIG. 5, the arrangement shown in FIG. 4 and in particular first electrically insulating layer structure 108' is then cured, for instance by applying heat and/or pressure. Thereby, a lamination procedure may be carried out or simulated. During curing, the length of uncured first electrically insulating layer structure 108' is reduced by shrinking to thereby obtain cured first electrically insulating layer structure 108.

Figure 6:
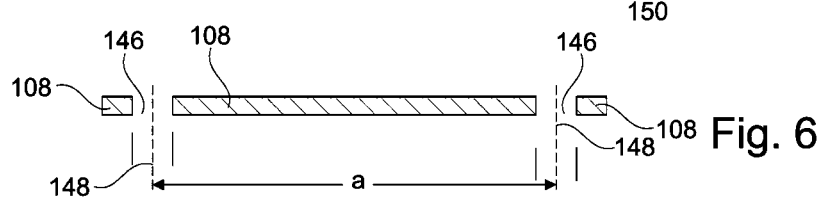

Referring to FIG. 6, a cured length "a" of said first electrically insulating layer structure 108 (i.e., obtained by curing the previously uncured first electrically insulating layer structure 108') is determined in a cured condition. For this purpose, the layer which is being converted from uncured first electrically insulating layer structure 108' to cured first electrically insulating layer structure 108 by curing is removed from the base 150 and from the bottom layer 142. Then, the distance between the centers 148 is re-measured after curing. Due to slight shrinkage during curing, a<A. After having determined cured length "a", the curing shrinkage value may be calculated based on the formula (A−a)/A.

Figure 7:
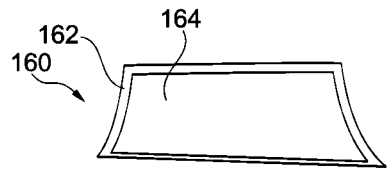
FIG. 7 is an image of a conventional panel used for manufacturing component carriers and showing significant warpage.
Figure 8:
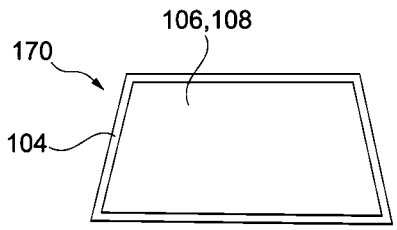
FIG. 8 is an image of a panel having a dielectric material with a low curing shrinkage value used for manufacturing component carriers according to an exemplary embodiment of the invention and showing strongly suppressed warpage.

Reference data shown in FIG. 7 and FIG. 8 have been derived from runs in a production line with different shrinkage factor materials.

FIG. 7 is an image 160 of a conventional panel having an electrically conductive layer structure 162 and an electrically insulating layer structure 164 thereon. As shown, said panel being conventionally used for manufacturing component carriers shows significant warpage. The dielectric material used for the panel according to FIG. 7 has a value of the Young modulus of 4 GPa. It shows a pronounced warpage of 44 mm.

FIG. 8 is an image 170 of a panel having a dielectric first electrically insulating layer structure 108 with a low curing shrinkage value used for manufacturing component carriers 100 according to an exemplary embodiment of the invention and showing strongly suppressed warpage.

The dielectric material used for the panel according to FIG. 8 has a value of the Young modulus of 10 GPa. It shows zero warpage thanks to the use of the dielectric first electrically insulating layer structure 108 with low curing shrinkage value of less than 1%. Highly advantageously, dielectric material of the component carrier 100 according to an exemplary embodiment of the invention may have even a higher value of the Young modulus, so that the effort of providing this first electrically insulating layer structure 108 is even lower than conventionally. At the same time, the warpage behavior is significantly improved. The first electrically insulating layer structure 108 with larger Young modulus value but with much improved shrinkage performance provides a highly advantageous warpage performance.

Figure 9:
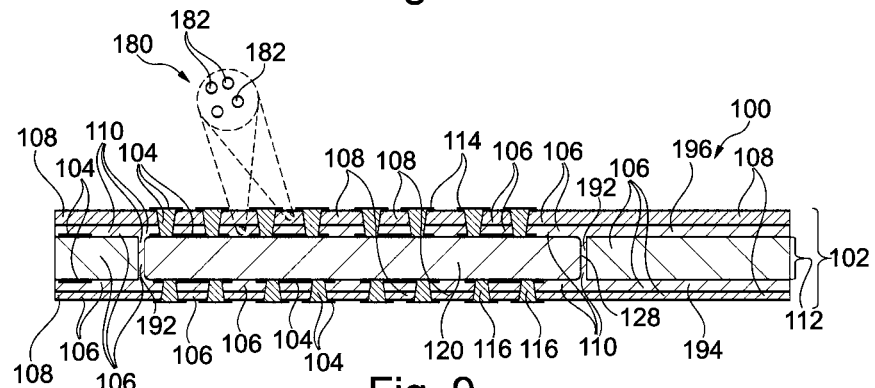
FIG. 9, FIG. 10, FIG. 11 and FIG. 12 illustrate cross-sectional views of component carriers according to other exemplary embodiments of the invention.

FIG. 9 illustrates a cross-sectional view of a component carrier 100 according to another exemplary embodiment of the invention.

According to FIG. 9, the high Young modulus low curing shrinkage-type first electrically insulating layer structure 108 is spaced with regard to the embedded component 120 by second electrically insulating layer structure 110. Said second electrically insulating layer structure 110 may advantageously have a low value of the Young modulus, for instance below 1 GPa. Thus, the second electrically insulating layer structure 110 may function as a soft mechanical buffer for protecting the embedded component 120. As shown in FIG. 9, said second electrically insulating layer structure 110 directly surrounds the component 120 with physical contact. The second electrically insulating layer structure 110 may have a relatively large curing shrinkage value of for instance more than 2%. Since low curing shrinkage-type first electrically insulating layer structure 108 provides for a low warpage configuration of component carrier 100, the second electrically insulating layer structure 110 does not need to fulfill this material property. This increases the freedom of selecting the material of the second electrically insulating layer structure 110 with physical properties (value of the Young modulus and curing shrinkage value in the present example) different from the physical properties of the first electrically insulating layer structure 108.

As shown in FIG. 9, the low curing shrinkage-type first electrically insulating layer structure 108 forms two exterior opposing layers of the stack 102 with the component 120 and the second electrically insulating layer structure 110 in between. The low curing shrinkage-type first electrically insulating layer structure 108 forms outermost layers of the stack 102.

In this embodiment, component 120 may be embedded in a through hole extending through the core 112. Thereafter, component 120 may be glued in place by laminating organic dielectric material of second electrically insulating layer structure 110. Thereby, upper and lower main surfaces as well as sidewalls 128 of component 120 may be surrounded by material of the cured second electrically insulating layer structure 110. As shown, said second electrically insulating layer structure 110 has a shell 192 directly surrounding the component 120 and two opposing layers 194, 196 sandwiching the component 120 and the shell 192 and extending laterally beyond all sidewalls 128 of the component 120.

As shown in a detail 180 in FIG. 9, said first electrically insulating layer structure 108 and/or said second electrically insulating layer structure 110 may be functionalized, for example by adding corresponding filler particles 182 with desired physical properties. For instance, such filler particles 182 may provide the first electrically insulating layer structure 108 and/or the second electrically insulating layer structure 110 with a high thermal conductivity, a low loss at high signal frequency, and/or high flow properties during lamination.

Advantageously, the embodiment of FIG. 9 combines first electrically insulating layer structure 108 (providing a high mechanical board strength in view of its high Young modulus and low shrinkage properties) with the second electrically insulating layer structure 110 (providing an encapsulation with low Young modulus material).

Thus, FIG. 9 shows different electrically insulating layer structures 106, i.e., in particular first layer structures relating to said first electrically insulating layer structure 108 and second layer structures relating to said second electrically insulating layer structure 110. As described above, the first electrically insulating layer structure 108 and the second electrically insulating layer structure 110 have different physical properties and are nevertheless in direct physical contact with each other. More specifically, the electrically insulating layer structures 106 relating to first electrically insulating layer structure 108 and the other electrically insulating layer structures 106 relating to the second electrically insulating layer structure 110 may be pressed together with direct physical contact and/or may be thermally interconnected during lamination.

As shown in FIG. 9, the second electrically insulating layer structure 110 directly surrounds the component 120. The second electrically insulating layer structure 110 has shell 192 surrounding the component 120. The first electrically insulating layer structure 108 has two opposing layers sandwiching the component 120 and the second electrically insulating layer structure 110 and extending laterally beyond all sidewalls 128 of the component 120. More specifically, the shell 192 surrounds all sidewalls 128 of the component 122 and both of two opposing main surfaces of the component 120.

Figure 10:
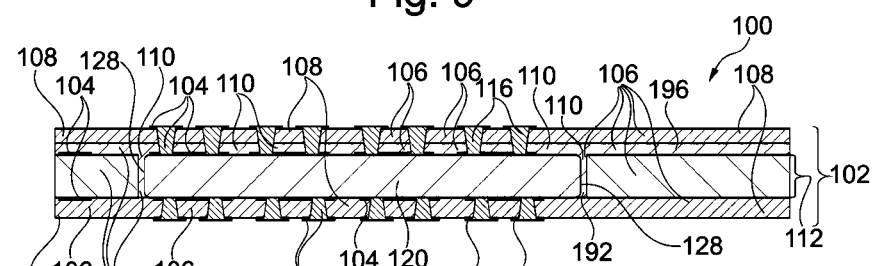

FIG. 10 illustrates a cross-sectional view of a component carrier 100 according to still another exemplary embodiment of the invention.

The embodiment of FIG. 10 differs from the embodiment of FIG. 9 in that, according to FIG. 10, the second electrically insulating layer structure 110 only surrounds sidewalls 128 and an upper main surface of the embedded component 120. More specifically, said second electrically insulating layer structure 110 has a shell 192 surrounding only part of the component 120 and has one layer 196 extending laterally beyond all sidewalls 128 of the component 120 up to the lateral edges of the component carrier 100. According to FIG. 10, a lower main surface of the embedded component 120 is in direct physical contact with first electrically insulating layer structure 108.

Figure 11:
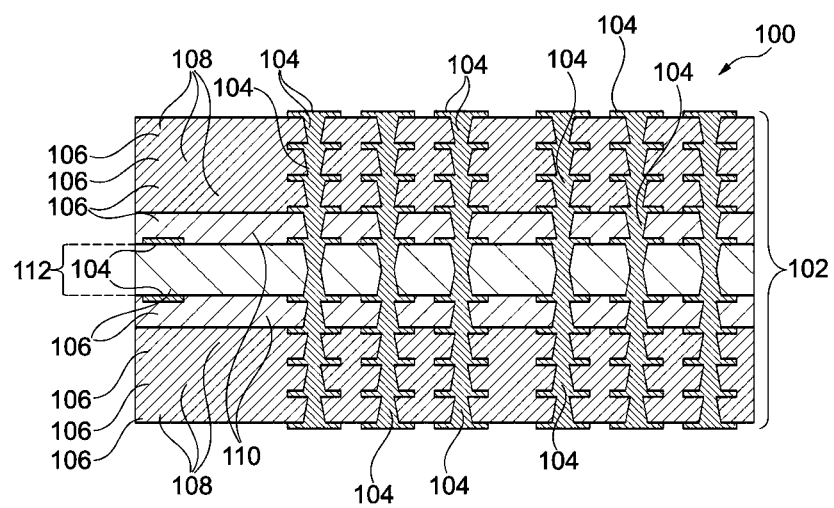

FIG. 11 illustrates a cross-sectional view of a component carrier 100 according to yet another exemplary embodiment of the invention, which does not have an embedded component 120 (although, in other embodiments, an embedded component 120 may be foreseen in FIG. 11 as well).

FIG. 11 illustrates a PCB-type component carrier 100 with central core 112 and a symmetrical stack-up or build-up upwardly and downwardly. First and second electrically insulating layer structures 108, 110 with different physical properties are provided on both opposing main surfaces of core 112, as shown in FIG. 11. For instance, the first electrically insulating layer structures 108 or the second electrically insulating layer structures 110 may be made of a low Young modulus material. In particular, such a low Young modulus material may have a value of the Young modulus below 3 GPa, in particular below 1 GPa. It is also possible that the first electrically insulating layer structures 108 or of the second electrically insulating layer structures 110 may be made of a high Young modulus material. For instance, such a high Young modulus material has a value of the Young modulus above 3 GPa, in particular above 5 GPa, more particularly above 8 GPa. Moreover, the component carrier 100 may be configured so that the first electrically insulating layer structures 108 or the second electrically insulating layer structures 110 may be made of a low loss material having low loss for high frequencies. For example, such a low loss material may have a loss or dissipation factor of not more than 0.004 at a frequency of 1 GHz. In yet another alternative, it is possible that the first electrically insulating layer structures 108 or the second electrically insulating layer structures 110 may be made of a highly thermally conductive material. For example, such a highly thermally conductive material has a thermal conductivity of at least 1 W/mK, in particular at least 2 W/mK. In still another alternative, the first electrically insulating layer structures 108 or the second electrically insulating layer structure 110 are made of a high flow material, i.e., a material having low viscous properties during curing. By taking these measures, it is possible to precisely adjust the physical properties of the component carrier 100 shown in FIG. 11.

Figure 12:
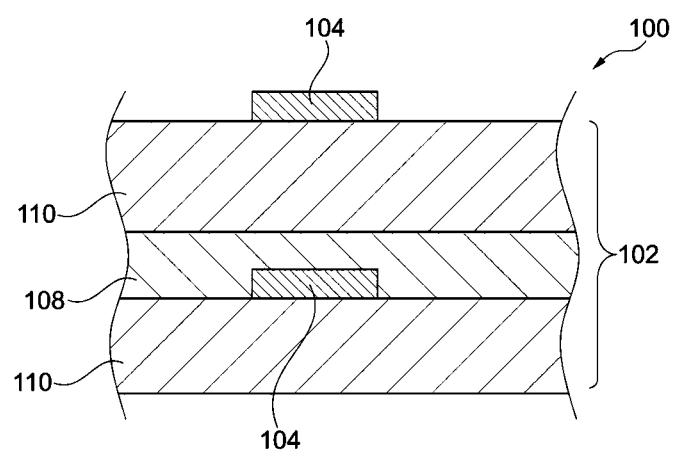

FIG. 12 illustrates a cross-sectional view of a component carrier 100 according to still another exemplary embodiment of the invention.

The component carrier 100 of FIG. 12 may be configured as coreless component carrier 100, i.e., may not have a core 112. FIG. 12 shows a portion of the component carrier 100 with electrically conductive traces in form of the electrically conductive layer structures 104, and with first and second electrically insulating layer structures 108, 110 having different physical properties. For instance, the first electrically insulating layer structure 108 may be made of a low df material, in particular may have a loss factor of not more than 0.004 at a frequency of 1 GHz. For instance, the second electrically insulating layer structures 110 may have a high peel strength, for instance for suppressing delamination.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which variants use the solutions shown and the principle according to the invention even in the case of fundamentally different embodiments.

The invention claimed is:

1. A component carrier, comprising:
   a stack comprising at least one electrically conductive layer structure, a first electrically insulating layer structure and a second electrically insulating layer structure;
   wherein the first electrically insulating layer structure is made of a material which has first physical properties;
   wherein the second electrically insulating layer structure is made of another material which has second physical properties differing from the first physical properties;
   wherein the first electrically insulating layer structure and the second electrically insulating layer structure are at least partially in direct physical contact with each other;
   a component embedded in the stack;
   wherein the second electrically insulating layer structure directly surrounds at least part of the component;
   wherein the second electrically insulating layer structure has a shell at least partially surrounding the component.

2. The component carrier according to claim 1, wherein one of the first electrically insulating layer structure and the second electrically insulating layer structure is made of a low Young modulus material.

3. The component carrier according to claim 2, wherein the low Young modulus material has a value of the Young modulus below 3 GPa.

4. The component carrier according to claim 1, wherein one of the first electrically insulating layer structure and the second electrically insulating layer structure is made of a high Young modulus material.

5. The component carrier according to claim 4, wherein the high Young modulus material has a value of the Young modulus above 3 GPa.

6. The component carrier according to claim 1, wherein one of the first electrically insulating layer structure and the second electrically insulating layer structure is made of a low loss material having low loss for high frequencies.

7. The component carrier according to claim 6, wherein the low loss material has a loss factor of not more than 0.004 at a frequency of 1 GHz.

8. The component carrier according to claim 1, wherein one of the first electrically insulating layer structure and the second electrically insulating layer structure is made of a low shrinkage material having a curing shrinkage value of less than 1%.

9. The component carrier according to claim 8, comprising at least one of the following features:
   wherein the low shrinkage material is a high Young modulus material;
   wherein the other one of the first electrically insulating layer structure and the second electrically insulating layer structure is made of a material having a higher curing shrinkage value than 1%.

10. The component carrier according to claim 8, wherein the curing shrinkage value of said material of the first electrically insulating layer structure and/or the second electrically insulating layer structure is measured by:
- connecting a layer of said material in an uncured condition and with an initial length "A" on a base;
- curing said layer;
- determining a length "a" of the cured layer in a cured condition of said material; and
- calculating the curing shrinkage value as (A−a)/A.

11. The component carrier according to claim 1, wherein one of the first electrically insulating layer structure and the second electrically insulating layer structure is made of a highly thermally conductive material.

12. The component carrier according to claim 11, wherein the highly thermally conductive material has a thermal conductivity of at least 1 W/mK.

13. The component carrier according to claim 1, comprising at least one of the following features:
- wherein one of the first electrically insulating layer structure and the second electrically insulating layer structure is made of a high flow material.

14. The component carrier according to claim 13, comprising at least one of the following features:
- wherein the component is selected from a group consisting of an electronic component, an electrically non-conductive and/or electrically conductive inlay, a heat transfer unit, a light guiding element, an optical element, a bridge, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip.

15. The component carrier according to claim 14,
- the first electrically insulating layer structure has two opposing layers sandwiching the component and the second electrically insulating layer structure and extending laterally beyond all sidewalls of the component and/or extending laterally beyond the shell.

16. The component carrier according to claim 15, wherein the shell surrounds all sidewalls of the component and only one or both of two opposing main surfaces of the component.

17. The component carrier according to claim 13, wherein a ratio between a length of the embedded component and a length of the component carrier is at least 30%.

18. The component carrier according to claim 1, comprising at least one of the following features:
- the component carrier is configured as coreless component carrier;
- the component carrier is configured as rigid component carrier;
- wherein the first electrically insulating layer structure and the second electrically insulating layer structure are in direct physical contact with each other without any electrically conductive material in between;
- wherein at least one of the first electrically insulating layer structure and the second electrically insulating their structure is functionalized with at least one of the group consisting of a high thermal conductivity function, a low loss at high frequency function, and a high flow function.

19. The component carrier according to claim 1, comprising at least one of the following features:
- wherein the at least one electrically conductive layer structure comprises at least one of the group consisting of copper, aluminum, nickel, silver, gold, palladium, and tungsten;
- wherein at least one of the first electrically insulating layer structure and the second electrically insulating layer structure comprises at least one of the group consisting of reinforced resin, non-reinforced resin, epoxy resin, or Bismaleimide-Triazine resin, FR-4, FR-5, cyanate ester, polyphenylene derivate, glass, prepreg material, polyimide, polyamide, liquid crystal polymer, epoxy-based build-up material, polytetrafluoroethylene, a ceramic, and a metal oxide;
- wherein the component carrier is shaped as a plate;
- wherein the component carrier is configured as one of the group consisting of a printed circuit board, and a substrate;
- wherein the component carrier is configured as a laminate-type component carrier.

20. A method of manufacturing a component carrier, comprising:
- forming a stack comprising at least one electrically conductive layer structure, a first electrically insulating layer structure and a second electrically insulating layer structure;
- configuring the first electrically insulating layer structure of a material having first physical properties;
- configuring the second electrically insulating layer structure of another material having second physical properties differing from the first physical properties;
- arranging the first electrically insulating layer structure and the second electrically insulating layer structure at least partially in direct physical contact with each other; and
- embedding a component in the stack;
- wherein the second electrically insulating layer structure directly surrounds at least part of the component;
- wherein the second electrically insulating layer structure has a shell at least partially surrounding the component.

* * * * *